United States Patent [19]

Inukai et al.

[11] Patent Number: 4,647,475
[45] Date of Patent: Mar. 3, 1987

[54] METHOD FOR MAKING MULTILAYER LIGHT SENSITIVE ELECTRON RADIATION CURED COATING

[75] Inventors: Yuzo Inukai; Yasuhito Naruse, both of Fujieda; Takao Nakayama, Shimada; Nobuyoshi Kaneko, Shizuoka, all of Japan

[73] Assignee: Fuji Photo Film Co., Ltd., Minami-ashigara, Japan

[21] Appl. No.: 745,132

[22] Filed: Jun. 17, 1985

[30] Foreign Application Priority Data

Jun. 18, 1984 [JP] Japan .................. 59-124983
Sep. 19, 1984 [JP] Japan .................. 59-195966

[51] Int. Cl.[4] .................................... B05D 3/06
[52] U.S. Cl. ........................................ 427/44; 430/49; 430/156
[58] Field of Search .................. 427/44; 430/49, 156

[56] References Cited

U.S. PATENT DOCUMENTS

| 3,959,521 | 5/1976 | Suetsugi et al. | 427/44 |
| 4,070,497 | 1/1978 | Wismer et al. | 427/44 |
| 4,113,895 | 9/1978 | Watt et al. | 427/44 |
| 4,435,491 | 3/1984 | Kitamura et al. | 430/60 X |
| 4,468,436 | 8/1984 | Okita | 427/44 X |
| 4,500,617 | 2/1985 | Nakayama | 430/49 |
| 4,571,316 | 2/1986 | Naruse et al. | 427/44 X |

Primary Examiner—Thurman K. Page
Attorney, Agent, or Firm—Fleit, Jacobson, Cohn & Price

[57] ABSTRACT

A method for making multilayer coating on a support, which comprises simultaneously applying multiple layers of at least two nonaqueous coating liquids on the support, at least one of the liquids containing an electron radiation curable compound, irradiating the applied layers with electron rays at a rate of 50 Mrad/sec. or less to cure them or to increase the viscosity thereof, and then drying. This method can be applied to the production of presensitized plates, multilayer photographic materials, multilayer analytical elements, etc.

8 Claims, 3 Drawing Figures

METHOD FOR MAKING MULTILAYER LIGHT SENSITIVE ELECTRON RADIATION CURED COATING

BACKGROUND OF THE INVENTION (1) Field of the Invention

This invention relates to a method for making a multilayer coating and more particulary, to a method for the manufacture of a multilayer coating on a continuously traveling flexible support or web, which comprises simultaneously applying multiple layers of at least two nonaqueous coating liquids to form the multilayer coating on the web without interlayer diffusion or mixing of the applied layers.

(2) Description of the Prior Art

There have been known various methods for making a multilayer coating in an aqueous system, which comprise simultaneously applying multiple layers of gelatino silver halide emulsions on a support using a coating device such as of the slide hopper or extrusion hopper, cooling the applied layers with chill rolls or cold air to cause the gelation of the multilayer coating using the sol-gel transformation property of gelatin so that the viscosity of the applied layers increases to tens of thousands to hundreds of thousands of centipoises (cps) and no interlayer mixing occurs, and then drying the coating by e.g. hot air.

There have been known multilayer materials having two or more nonaqueous coatings, such as, light-sensitive materials for use in the production of printing plates using electrophotography comprising a photoconductive insulating layer and a light-sensitive layer, as described in U.S. Pat. Nos. 4,435,491 and 4,500,617 and light-sensitive materials for use in the production of printing plates comprising two or more light-sensitive layers separately provided or comprising a light-sensitive layer and an overcoat or undercoat layer, as described in Japanese Patent Public Disclosure No. 58-205154, U.S. Pat. Nos. 4,217,407 and 4,207,106, German Pat. Nos. 1,621,478 and 1,091,433, and U.S. Pat. No. 3,511,661.

Nonaqueous coating liquids have lower surface tension than aqueous coating liquids and therefore, if the former liquids are simultaneously coated and dried to form the light-sensitive and photoconductive insulating layers, or the two or more separated light-sensitive layers, or the overcoat or undercoat and the light-sensitive layers, interlayer diffusion or mixing of the coating liquids applied is liable to occur not only in the drying zone but also in the ribbon of coating composition between the coating head and the surface to be coated, or between coating and drying steps. The interlayer diffusion or mixing is accelerated because of the absence of sol-gel transformation in the nonaqueous system and therefore, it is very difficult in the nonaqueous system to form a multilayer coating in which each of the coated layers is properly separated from one another. There have not been found sol-gel transforming agents suitable for use in various nonaqueous solutions or other effective methods for making a multilayer coating in a nonaqueous system.

For this reason, multilayer coated materials, for example, light-sensitive materials for use in the production of printing plates are made by a method wherein light-sensitive and photoconductive insulating layers, or two or more light-sensitive layers are coated and dried on a hydrophilic support one after another (hereinafter referred to as the stepwise coating and drying method). The stepwise coating and drying method includes a method wherein each time a coating liquid is applied and dried on a support, the support is wound up, and a method wherein two or more coating and drying zones are provided so that two or more coating liquids are successively coated on a support and dried. The former method requires much time and expense for the production of the materials, while the latter requires very expensive equipment and high cost for the production of the materials.

There have recently been proposed several methods for making a coating on a support using electron radiation to cure the coating. For example, Japanese Patent Publication 54-19894 and Japanese Patent Public Disclosure 56-38160 disclose a method for making a single layer coating and Japanese Patent Publication 53-16403 and Japanese Patent Public Disclosure 58-24384 disclose a method for making a multilayer coating. However, this multilayer coating is made by the stepwise coating and drying method, i.e. the method wherein each time a single layer is applied, electron rays are irradiated. Thus, these methods using electron radiation do not solve the problems mentioned above.

SUMMARY OF THE INVENTION

An object of this invention is to provide a method for making a nonaqueous multilayer coating at a lower cost as compared with the prior art methods.

Another object of this invention is to provide a method for making a nonaqueous multilayer coating wherein coating liquids of any degree of viscosity can be applied on a support to make the multilayer coating thereon.

A further object of this invention is to provide a low cost method for the production of light-sensitive materials for use in making printing plates, as compared with the high cost stepwise coating and drying method of the prior art.

The objects of this invention can be accomplished by a method for making a multilayer coating, which comprises simultaneously applying multiple layers of at least two nonaqueous coating liquids on a continuously traveling flexible support, at least one of said coating liquids containing an electron radiation curable compound, irradiating the applied layers with electron rays at a rate of 50 Mrad/sec. or less to cure the applied layers or to increase the viscosity thereof, and then drying.

DETAILED DESCRIPTION OF THE INVENTION

This invention is characterized in that at least one of two or more nonaqueous coating liquids contains an electron radiation curable compound and after simultaneously applying multiple layers of the coating liquids, the applied layers are irradiated with electron rays at an irradiation rate of 50 Mrad/sec. or less. The term "irradiation rate of electron rays" means absorbed dose per unit time by an irradiated object and it is also referred to as a dose rate or an irradiation dose rate.

Electron ray irradiation at a rate of more than 50 Mrad/sec. delays or fails to cure the applied layer containing an electron radiation curable compound or to increase the viscosity thereof, which leads to interlayer diffusion or mixing of the multiple applied layers and fails to form a desired multilayer coating.

In this invention, at least one nonaqueous coating liquid may contain a light-sensitive composition. The viscosity of the nonaqueous coating liquids used in this invention is not particularly limited but it is preferred that at least one of the nonaqueous coating liquids has a viscosity of 50 cps or more.

Thus, each of the nonaqueous coating liquids used in this invention may contain a light-sensitive composition or an electron radiation curable compound or may have a viscosity of 50 cps or more. Further, both the light-sensitive composition and the electron radiation curable compound may be included in a single nonaqueous coating liquid.

Figure 1:
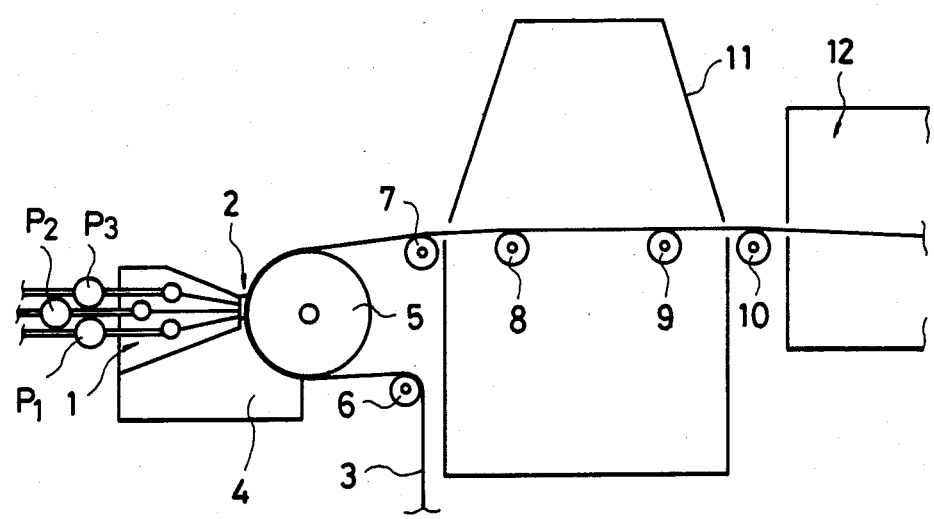
FIG. 1 is a schematic view of a preferred apparatus with which the coating method of this invention can be implemented.

The method of this invention can be conducted using the coating device as shown in FIG. 1. However, it is to be understood that this invention can be conducted using other coating devices such as a slide bead coater, a hopper slide coater, a curtain coater, etc.

This invention will now be explained in more detail with reference to FIG. 1.

APPARATUS AND METHOD FOR COATING AND DRYING

In FIG. 1, two or more nonaqueous coating liquids are fed from tanks (not shown) to a coating head 1 by constant delivery pumps, $P_1$, $P_2$, $P_3$, etc. and are simultaneously applied on a continuously traveling support 3. Reference number 2 denotes a narrow ribbon of the coating liquids, reference number 5 denotes a backing roll and reference numbers 6, 7, 8, 9 and 10 denote pass rolls. A vacuum chamber 4 is kept under reduced pressure of about 10 to 20 mm $H_2O$ by a vacuum pump (not shown) so as to stabilize the ribbon 2. Reference numbers 11 and 12 denote an electron ray irradiator and a dryer, respectively.

At least one of the nonaqueous coating liquids contains an electron radiation curable compound. The amount of the compound contained in the coating liquid is not restricted but it is preferably in the range of 2 to 30 percent by weight on the basis of the solid content of the coating liquid.

The multiple layers applied on the support 3 are irradiated with electron rays in the electron ray irradiator 11 to cure the layer containing the electron ray curable compound or to increase the viscosity thereof. As a result, interlayer diffusion or mixing of the multiple layers is prevented. The multiple layers are then dried in the dryer 12 to form a desired multilayer coating on the support 3.

When at least one of the coating liquids has the viscosity of 50 cps or more, preferably 80 cps or more, it is also possible to prevent the interlayer diffusion or mixing of the multiple layers applied on the support between the coating head 1 and the irradiator 11. The time between the formation of the ribbon 2 and the irradiation in the irradiator 11 depends on the properties of the coating liquids and it is preferably not more than two seconds in order to prevent the interlayer diffusion or mixing.

Electron rays are irradiated under an accelerating voltage of 150 to 300 kV at an absorbed dose of 0.08 to 7 Mrad. An absorbed dose of less than 0.08 Mrad results in insufficient curing of the electron ray curable compound, while that of more than 7 Mrad affects the photographic properties of a light-sensitive layer, if the multiple layers applied contain the light-sensitive layer.

ELECTRON RADIATION CURABLE COMPOUNDS

Electron radiation curable compounds which can be contained in the nonaqueous coating liquids used in this invention are any of various known compounds which can be cured by irradiation with electron rays and can be dissolved in solvents even after cured. Among these compounds, particularly preferable compounds are those which contain epoxy or unsaturated bond which is polymerizable by electron radiation, for example, compounds having one, preferably two or more vinyl or vinylidene or epoxy groups, compounds having acryloyl, acrylamide, allyl or vinylether group, etc., unsaturated polyesters, and epoxy resins.

Particularly preferable compounds are those having unsaturated bond, i.e. those having acryloyl or methacryloyl groups at both terminal ends of the straight chain which are described in A. Vrancken "Fatipec Congreess" 11 19 (1972), for example, the compound of the formula:

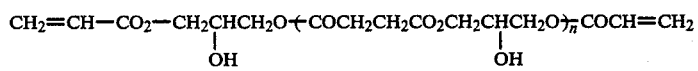

The polyester skelton of the illustrated compound can be replaced by the skelton of polyurethane, epoxy resin, polyether, polycarbonate or mixtures thereof. The terminal acryloyl groups of these compounds may be replaced by methacryloyl groups. The molecular weight of these compounds is preferably in the range of about 500 to about 20,000.

Among these compounds, commercially available ones include ARONIX (trademark) M6100 and M7100 produced by TOA GOSEI, Japan.

Monomers having carbon-carbon double bond may also be used. Examples of such monomers include acrylic acid, methacrylic acid, itaconic acid, alkyl acrylates such as methyl acrylate, alkyl methacrylates such as methyl methacrylate, styrene, styrene derivatives such as alpha-methyl styrene, beta-chlorostyrene, acrylonitrile, methacrylonitrile, acrylamide, methacrylamide, vinyl acetate, vinyl propionate, etc. These compounds may contain two or more unsaturated bonds. Examples of such compounds are described in KAN-KOSEI JYUSHI DATA SHU (Light-sensitive resin data) published by SOGO KAGAKU KENKYUSHO, Japan, December, 1968, pp 235-236. Preferable compounds include unsaturated esters of polyols, e.g., 2-hydroxyethyl acrylate, 2-hydroxyethyl methacrylate, ethyleneglycol diacrylate, butoxyethyl acrylate, 1,4-butanediol diacrylate, 1,6-hexanediol acrylate, stearyl acrylate, 2-ethylhexyl acrylate, tetrahydrofurfuryl methacrylate, diethyleneglycol diacrylate, diethyleneglycol dimethacrylate, tetraethyleneglycol diacrylate, neopentylglycol dimethacrylate, neopentylglycol diacrylate, glycerol trimethacrylate, trimethylolpropane triacrylate, pentaerythritol triacrylate, ethyleneglycol dimethacrylate, pentaerylthritol tetramethacrylate, dipentaerythritol hexaacrylate, etc. and glycidyl methacrylate which has an epoxy group.

SUPPORT

Flexible supports which can be used in this invention include papers, plastic films, metals, resin-coated papers, synthetic papers, etc. The plastic films include polyolefins such as polyethylene, polyproplyene, etc., vinyl polymers such as polyvinyl acetate, polyvinyl chloride, polystyrene, etc., polyamides such as 6,6-nylon, 6-nylon, etc., polyesters such as polyethylene terephthalate, polyethylene-2,6-naphthalate, etc., polycarbonates, and cellulose acetates such as cellulose triacetate, cellulose diacetate, etc. Typical examples of resins for use in the resin-coated papers are polyolefins such as polyethylene, to which this invention is not limited.

A support having a hydrophilic surface and suitable for use in making light-sensitive materials such as presensitized plates is one which has a dimensionally stable surface and is in the shape of a sheet, a plate, etc. The shape is suitably selected depending on the specific purpose of the materials to be made. Materials of the support include metal plates such as aluminum, aluminum alloys, zinc, iron, copper etc.; papers; plastic films such as polyethylene terephthalate, polypropylene, polycarbonate, polyvinyl acetal, cellulose diacetate, cellulose triacetate, cellulose butyrate, cellulose acetate butyrate, cellulose propionate, cellulose nitrate, etc.; papers or plastic films on which metal is laminated or deposited; plastic films having provided thereon a layer containing alumina sol, silica sol, or fine particles of inorganic metal salts such as KCl, NaNO$_3$, etc., or metal oxides such as In$_2$O$_3$, SnO$_2$, conductive ZnO, etc. The materials of the support are also suitably selected depending on purposes and applications of the light-sensitive materials for use in making printing plates. Conductive materials must be selected in order to make light-sensitive materials having an electrophotographic light-sensitive layer.

The viscosity of coating liquids can be regulated by the structure and content of a binder contained in the coating liquids and/or by the addition of inorganic materials such as finely divided silica powder, high-purity montmorillonite-organic base complex, microfine precipitated calcium carbonate, etc. which are suitably selected depending on the desired properties of the light-sensitive materials for use in making printing plates, the composition or the desired viscosity of the coating liquids.

This invention can be applied to the production of multilayer coated materials having two or more nonaqueous coatings on a flexible support. Examples of such multilayer coated materials include various photographic materials, light-sensitive materials used in making printing plates, multilayer analytical elements, etc. Specific examples of the light-sensitive materials which are used in making printing plates and which have at least two nonaqueous coated layers include one having an o-quinone diazide light-sensitive layer and a resin layer as described in U.S. Pat. Nos. 4,207,106 and 4,217,407 and British Pat. No. 1,488,350; one having two light-sensitive layers of o-quinone diazide as described in Japanese Patent Public Disclosure 56-126836; one having an o-quinone diazide light-sensitive layer and an azide compound light-sensitive layer as described in U.S. Pat. No. 4,191,537; one having a light-sensitive layer and an organic resin layer as described in U.S. Pat. No. 3,136,637; one having an o-quinone diazide light-sensitive layer and an electrophotographic light-sensitive layer; etc.

LIGHT-SENSITIVE COMPOSITIONS

Light-sensitive compositions which can be used to make light-sensitive liquids used in this invention include the following:

(1) Compositions comprising diazo resin

There can be used both water-soluble and water-insoluble diazo resins, one representative example of which is a condensate between p-diazodiphenylamine and paraformaldehyde. Preferably, there may be used those which are insoluble in water but are soluble in conventional organic solvents. Particularly desirable diazo compounds are those having two or more diazo groups in a molecule, such as salts of a condensate between p-diazodiphenylamine and formaldehyde or acetaldehyde, e.g. salts of phenol, salts of fluorocapric acid and salts of sulfonic acids, such as triisopropylnaphthalenesulfonic acid, 4,4-biphenyldisulfonic acid, 5-nitro-ortho-toluenesulfonic acid, 5-sulfosalicylic acid, 2,5-dimethylbenzenesulfonic acid, 2-nitrobenzenesulfonic acid, 3-chlorobenzenesulfonic acid, 3-bromobenzenesulfonic acid, 2-chloro-5-nitrobenzenesulfonic acid, 2-fluorocaprylnaphthalenesulfonic acid, 1-naphthol-5-sulfonic acid, 2-methoxy-4-hydroxy-5-benzoyl-benzenesulfonic acid, paratoluenesulfonic acid, etc. In addition, desirable diazo resins include salts between 2,5-dimethoxy-4-p-tolylmercaptobenzene-diazonium/formaldehyde condensate or 2,5-dimethoxy-4-morpholinobenzenediazonium/formaldehyde or acetaldehyde condensate and the acids described above.

The diazo resin as described in U.K. Pat. No. 1,312,925 can also be preferably used.

These diazo resins may be used alone to form a light-sensitive composition for use in making resist but are preferably used in combination with a binder.

As such as binder, there may be used various high-molecular compounds, preferably having hydroxy, amino, carboxyl, amido, sulfonamido, active methylene, thioalcohol or epoxy group, etc. Examples of preferable binders include shellac as described in U.K. Pat. No. 1,350,521; polymers having, as a main repeating unit, hydroxyethylacrylate or hydroxyethylmethacrylate unit as described in U.K. Pat. No. 1,460,978 and U.S. Pat. No. 4,123,276; polyamide resin as described in U.S. Pat. No. 3,751,257; phenol resin and polyvinyl acetal resin such as polyvinyl formal and polyvinyl butyral resins as described in U.K. Pat. No. 1,074,392; linear polyurethane resin as described in U.S. Pat. No. 3,660,097; polyvinyl alcohol phthalated resin, epoxy resin derived from bisphenol A and epichlorhydrin, polymers having amino group such as polyaminostyrene and polyalkylamino(metha)acrylate, celluloses such as cellulose acetate, cellulose alkylether, cellulose acetate phthalate.

The amount of binder contained in the light-sensitive resist-forming composition is suitably in the range of 40 to 95 percent by weight. The more the amount of binder (i.e. the less the amount of diazo resin) becomes, the greater the light-sensitivity becomes but the lower the stability over time becomes. The optimum amount of binder is in the range of about 70 to 90 percent by weight.

The composition comprising the diazo resin may further contain additives such as phosphoric acid, dyes, pigments, etc. as described in U.S. Pat. No. 3,236,646.

(2) Compositions comprising o-quinone diazide compound

Preferable o-quinone diazide compounds used in this invention are o-naphthoquinone diazide compounds which are described in many publications including U.S. Pats. Nos. 2,766,118, 2,767,092, 2,772,972, 2,859,112, 2,907,665, 3,046,110, 3,046,111, 3,046,115, 3,046,118, 3,046,119, 3,046,120, 3,046,121, 3,046,122, 3,046,123, 3,061,430, 3,102,809, 3,106,465, 3,635,709 and 3,647,443. Among these compounds, o-naphthoquinone diazide sulfonates and o-naphtoquinone diazide carbonates of aromatic hydroxy compounds, and o-naphthoquinone diazide sulfonamides and o-naphthoquinone diazide carbonates of aromatic amine compounds are preferable. Particularly preferred compounds are pyrogallol/acetone condensate esterified by o-naphthoquinone diazide sulfonic acid as described in U.S. Pat. No. 3,635,709; polyester having hydroxyl groups at the terminal ends and esterified by o-naphthoquinone diazide sulfonic acid or o-naphthoquinone diazide carboxylic acid as described in U.S. Pat. No. 4,028,111; and homopolymer of p-hydroxystyrene or copolymer thereof with copolymerizable monomer, esterified by o-naphthoquinone diazide sulfonic acid or o-naphthoquinone diazide carboxylic acid as described in U.K. Pat. No. 1,494,043.

These o-quinonediazide compounds may be used alone, preferably in a combination with alkali-soluble resins. Suitable examples of alkali-soluble resins include phenolic novolak resins, specifically phenol-formaldehyde resin, o-cresol-formaldehyde resin, m-cresol-formaldehyde resin, etc. As described in U.S. Pat. No. 4,123,279, it is more desirable to use, in a combination with the phenol resins described above, a condensate of formaldehyde and phenol or cresol substituted by alkyl having 3 to 8 carbon atoms, e.g. t-butyl phenol-formaldehyde resin. The alkali-soluble resin is contained in the range of about 50 to about 85, preferably 60 to 80 percent by weight on the basis of the total amount of the light-sensitive resist-forming composition.

The light-sensitive composition comprising o-quinone diazide compound may contain pigments, dyes, plasticizers, etc. if desired.

(3) Compositions comprising light-sensitive azide compound

Suitable light-sensitive azide compounds include aromatic azide compounds wherein azide group is attached directly or through a carbonyl or sulfonyl group to the aromatic ring. These azide compounds photolyze to form nitrene which causes various reactions and finally forms an insoluble product. Preferable aromatic azide compounds include those having one or more groups such as azidophenyl, azidostyryl, azidobenzal, azidobenzoyl, azidocinnamoyl, etc., for example, 4,4'-diazidocalcon, 4-azido-4'-(4-azidobenzoylethoxy)-calcon, N,N-bis-p-azidobenzal-p-phenylenediamine, 1,2,6-tri(4'-azido-benzoxy)hexane, 2-azido-3-chloro-benzoquinone, 2,4-diazido-4'-ethoxyazobenzene, 2,6-di(4'-azidobenzal)-4-methylcyclo-hexanone, 4,4'-diazidobenzophenone, 2,5-diazido-3,6-dichloro-benzoquinone, 2,5-bis(4-azidostyryl)-1,3,4-oxadiazole, 2-(4-azidocinnamoyl)thiophene, 2,5-di(4'-azido-benzal)cyclohexanone, 4,4'-diazidodiphenylmethane, 1-(4-azidophenyl)-5-furyl-2-penta-2,4-diene-1-one, 1-(4-azidophenyl)-5-(4-methoxyphenyl)-penta-1,4-diene-3-one, 1-(4-azidophenyl)-3-(1-naphthyl)propene-1-one, 1-(4-azidophenyl)-3-(4-dimethylaminophenyl)-propane-1-one, 1-(4-azidophenyl)-5-phenyl-1,4-pentadiene-3-one, 1-(4-azidophenyl)-3-(4-nitrophenyl)-2-propene-1-one, 1-(4-azidophenyl)-3-(2-furyl)-2-propene-1-one, 1,2,6-tri(4'-azidobenzoxy)hexane, 2,6-bis-(4-azidobenzylidine-p-t-butyl)cyclohexanone, 4,4'-diazidodibenzalacetone, 4,4'-diazidostilbene-2,2'-disulfonic acid, 4'-azidobenzalacetophenone-2-sulfonic acid, 4,4'-diazidostilbene-alpha-carboxylic acid, di-(4-azido-2'-hydroxy-benzal)acetone-2-sulfonic acid, 4-azidobenzalacetophenone-2-sulfonic acid, 2-azido-1,4-dibenzenesulfonylaminonaphthalene, 4,4'-diazidostilbene-2,2'-disulfonic acid anilide, etc.

In addition to these low-molecular weight aromatic azide compounds, there may be used azido group—containing polymers as described in Japanese Patent Publication Nos. 44-9047, 44-31837, 45-9613, 45-24915 and 45-25713 and Japanese Patent Public Disclosure Nos. 50-5102, 50-84302, 50-84303 and 53-12984.

These light-sensitive azide compounds are preferably used together with high-molecular compounds as a binder. Suitable binders are alkali-soluble resins such as natural resins, e.g. shellac and rosin, phenolic novolak resins, e.g. phenol-formaldehyde resin and m-cresol-formaldehyde resin, homopolymer of unsaturated carboxylic acid and copolymer thereof with polymerizable monomer, e.g. polyacrylic acid, polymethacrylic acid, methacrylic acid—styrene copolymer, methacrylic acid—methyl acrylate copolymer, and styrene—maleic anhydride copolymer, resin obtained by partially or completely saponifying polyvinyl acetate, followed by partially acetalizing with aldehydes such as acetaldehyde, benzaldehyde, hydroxybenzaldehyde, carboxybenzaldehyde, etc., and polyhydroxystyrene. Further, organic solvent—soluble resins including cellulose alkylethers such as cellulose methylether, cellulose ethylether, etc. may also be used as a binder.

The amount of binder is preferably in the range of about 10 to about 90 percent by weight on the basis of the total weight of the composition comprising the light-sensitive azide compound.

The composition comprising the light-sensitive azide compound may further include such additives as dyes, pigments, plasticizers, e.g. phtalic acid esters, phosphoric acid esters, aliphatic carboxylic acid esters, glycols, and sulfonamides, and sensitizers, e.g. Michler's ketone, 9-fluorenone, 1-nitropyrene, 1,8-dinitropyrene, 2-chloro-1,2-benzanthraquinone, 2-bromo-1,2-benzanthraquinone, pyrene-1,6-quinone, 2-chloro-1,8-phthaloylnaphthalene, and cyanoacridine.

(4) Compositions comprising high-molecular compounds having —CH=CH—CO— group in the main or side chain thereof.

Examples of the above compositions include those comprising light-sensitive polymer having —CH=CH—CO— group in the main or side chain of the polymer, e.g. polyesters, polyamides and polycarbonates, as described in U.S. Pat. Nos. 3,030,208, 3,707,373 and 3,453,237; those comprising light-sensitive polyesters derived from 2-properidene malonic acid compound such as cinnamylidene malonic acid and bifunctional glycols, as described in U.S. Pat. Nos. 2,956,878 and 3,173,787; cinnamic acid esters of hydroxy-containing polymers such as polyvinyl alcohol, starch, cellulose and analogues thereof, as described in U.S. Pat. Nos. 2,690,966, 2,752,372 and 2,732,301. These compositions may further contain sensitizers, stabilizers, plasticizers, pigments, dyes, etc.

This invention will now be explained in more detail with reference to the following Examples to which this invention is not restricted.

EXAMPLE 1

With the coating device as shown in FIG. 1, the coating liquids as shown in Table 1 were simultaneously applied on a polyethylene terephthalate film of 1500 mm width and 180 micron thickness in the amount of 25 cc/m² for the overlying layer and 15 cc/m² for the underlying layer. One second after coating, the layers applied on the film were irradiated with electron rays under an accelerating voltage of 250 kV at an absorbed dose of 4 Mrad and an irradiation rate of 30 Mrad/sec. with the electron ray irradiatior 11 and subsequently dried at 90° C. in the dryer 12.

COMPARATIVE EXAMPLE 1

The same procedures as those of Example 1 were repeated, except that the irradiation rate was 75 Mrad/sec.

Figure 2:
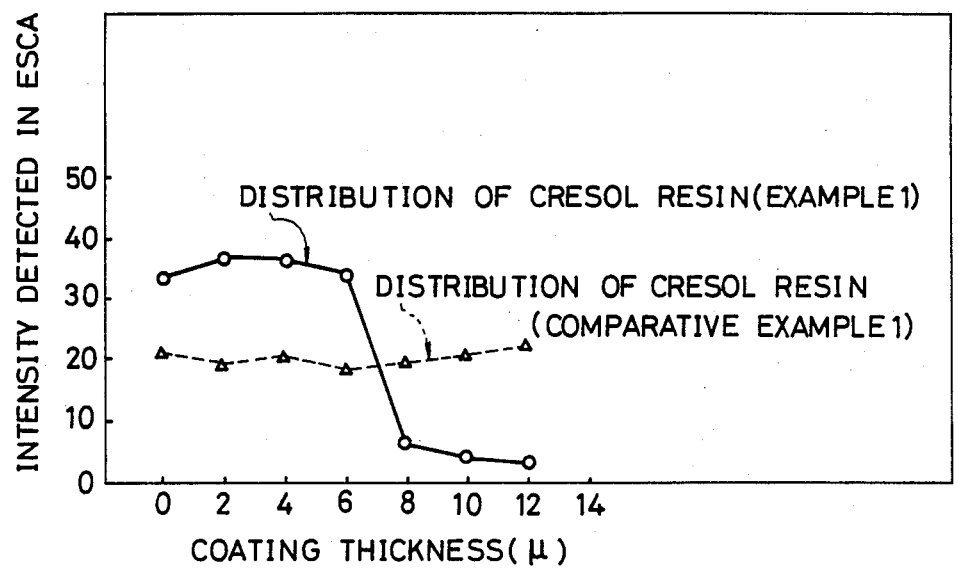
FIGS. 2 and 3 are graphs showing the effects of this invention.

By Electron Spectroscopy for Chemical Analysis, the coats prepared in Example 1 and Comparative Example 1 were analyzed for the chlorine contained in the cresol resin of the coats. The results are shown in FIG. 2 wherein the solid line and the dotted line show the distributions of intensities proportionate to the chlorine contents in the coats of Example 1 and Comparative Example 1, respectively. The results showed that the cresol resin was detected mainly in the overlying layer of the coat of Example 1 wherein the irradiation rate was less than 50 Mrad/sec. while in contrast it was detected almost evenly throughout the layers of the coat of Comparative Example 1 wherein the irradiation rate was more than 50 Mrad/sec., meaning that interlayer diffusion or mixing occured.

TABLE 1

|  | Parts by weight |
|---|---|
| The overlying layer coating composition | |
| Cresol resin (containing chlorine) | 21 |
| Polyester acrylate | 4 |
| Cellosolve acetate (Tradename) | 60 |
| Methyl ethyl ketone | 15 |
| Fluoro carbon type surface active agent | 0.1 |
| Viscosity (at 20° C.) | 60 cps |
| The underlying layer coating composition | |
| Phenol resin | 24 |
| Polyester acrylate | 6 |
| Cellosolve acetate | 52 |
| Methyl ethyl ketone | 18 |
| Viscosity (at 20° C.) | 45 cps |

EXAMPLE 2

With the coating device as shown in FIG. 1, the coating liquids as shown in Table 2 were simultaneously applied on a polyethylene terephthalate film of 1200 mm width and 180 micron thickness in the amount of 15 cc/m² for the overlying layer, 15 cc/m² for the intermediate layer and 5 cc/m² for the underlying layer. Three seconds after coating, the layers applied on the film were irradiated with electron rays under an accelerating voltage of 200 kV at an absorbed dose of 3 Mrad and an irradiation rate of 20 Mrad/sec. with the electron ray irradiator 11 and subsequently dried at 90° C. in the dryer 12.

COMPARATIVE EXAMPLE 2

The same procedures as those of Example 2 were repeated, except that the irradiation rate was 60 Mrad/sec.

Figure 3:
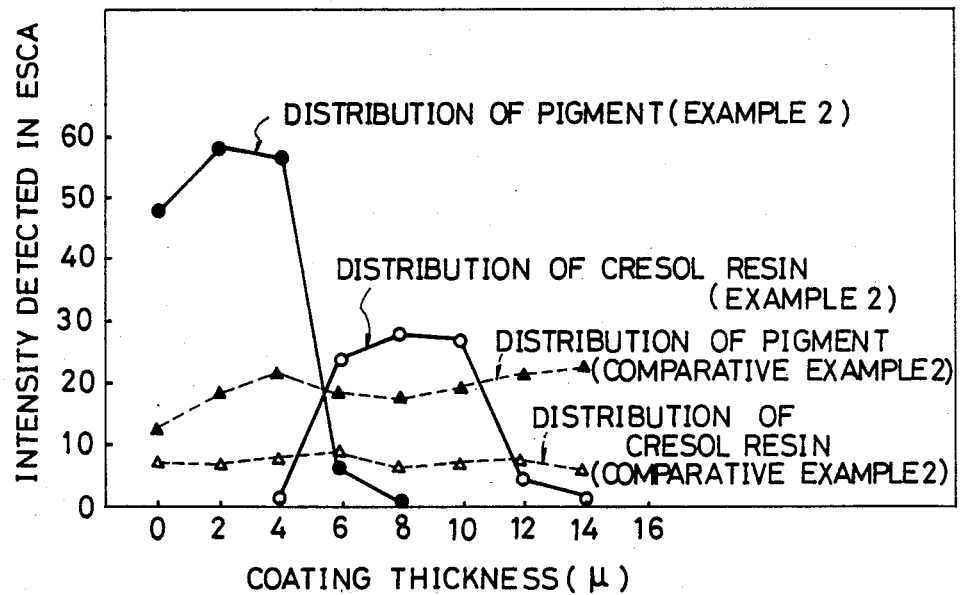

By Electron Spectroscopy for Chemical Analysis, the coats prepared in Example 2 and Comparative Example 2 were analyzed for the chlorine contained in the cresol resin and the copper contained in the pigment of the coats. The results are shown in FIG. 3 wherein the solid lines and the dotted lines show the distributions of intensities proportionate to the chlorine and copper contents in the coats of Example 2 and Comparative Example 2, respectively. The results showed that the pigment (copper) and the cresol resin (chlorine) were detected mainly in the overlying layer and the intermediate layer of the coat of Example 2, respectively, wherein the irradiation rate was less than 50 Mrad/sec. while in contrast they were detected almost evenly throughout the layers of the coat of Comparative Example 2 wherein the irradiation rate was more than 50 Mrad/sec., meaning that interlayer diffusion or mixing occured.

TABLE 2

|  | Parts by weight |
|---|---|
| The overlying layer coating composition | |
| Phenol resin | 24 |
| Polyester acrylate | 4.8 |
| Pigment (containing copper) | 1.2 |
| Cellosolve acetate | 54 |
| Methyl ethyl ketone | 16 |
| Viscosity (at 20° C.) | 75 cps |
| The intermediate layer coating composition | |
| Cresol resin (containing chlorine) | 25 |
| Polyester acrylate | 5 |
| Cellosolve acetate | 54 |
| Methyl ethyl ketone | 16 |
| Viscosity (at 20° C.) | 80 cps |
| The underlying layer coating composition | |
| Phenol resin | 30 |
| Cellosolve acetate | 54 |
| Methyl ethyl ketone | 16 |
| Viscosity (at 20° C.) | 50 cps |

EXAMPLE 3

2S aluminum plate of 0.2 mm thickness was degreased in a 10% aqueous solution of trisodium phosphate at 80° C. for 3 minutes, grained with a nylon brush and a pumice powder-water suspension, anodized in a 20% sulfuric acid solution, washed with water, and dried to prepare a support.

With the coating device as shown in FIG. 1, the coating liquids having the compositions and the viscosities as shown in Table 3 were simultaneously applied on the support traveling at the speed of 50 m/min. in the amount of 17 cc/m² for the overlying layer and 11 cc/m² for the underlying layer. Two seconds after coating, the layers applied on the support were irradiated with electron rays under an accelerating voltage of 250 kV at an absorbed dose of 1 Mrad and an irradiation rate of 20 Mrad/sec. with the electron ray irradiator 11 and subsequently dried with hot air at 90° C. in the dryer 12 to prepare Sample A.

The overlying layer coating liquids containing a phthalocyanine pigment and silica powder and the underlying layer coating liquids containing silica powder were prepared by ultrasonic dispersing.

TABLE 3

| The overlying layer coating composition | Parts by weight |
| --- | --- |
| Phenolic novolak resin (33% in methyl cellosolve acetate) | 12 |
| Ethyl acrylate - methyl methacrylate-methacrylic acid (62-25-13) copolymer (33% in methyl cellosolve acetate) | 3 |
| phthalocyanine pigment (Sumika print GN-0) | 1.0 |
| Pentaerythritol tetraacrylate | 0.3 |
| Methyl ethyl ketone | 10.2 |
| Methyl cellosolve acetate | 13.8 |
| Fluorocarbon type surface active agent | 0.04 |
| Silica powder (Aerosil produced by DEGUSSA) | 0.2 |
| Viscosity (at 20° C.) | 45 cps |
| The underlying layer coating composition | |
| Ester of naphthoquinone-(1,2)-diazido-(2)-5-sulfonylchloride and poly-p-hydroxystyrene | 7 |
| Phenolic novolak resin | 20 |
| Methyl ethyl ketone | 32.4 |
| Methyl cellosolve acetate | 75.6 |
| Silica powder (Aerosil produced by DEGUSSA) | 1.35 |
| Viscosity (at 20° C.) | 50 cps |

EXAMPLE 4

An aluminum plate was processed in the same manner as in Example 3 to prepare a support. The coating liquids having the compositions and the viscosities as shown in Table 4 were simultaneously applied on the support traveling at the speed of 50 m/min. with the coating device as shown in FIG. 1 in the amount of 17 cc/m² for the overlying layer, 3 cc/m² for the intermediate layer and 11 cc/m² for the underlying layer. Two seconds after coating, the layers applied on the support were irradiated with electron rays under an accelerating voltage of 250 kV at an absorbed dose of 1 Mrad and an irradiation rate of 20 Mrad/sec. in the electron ray irradiator 11 and subsequently dried with hot air at 90° C. in the dryer 12 to prepare Sample B.

The ultrasonic dispersing as used in Example 3 was carried out to prepare the overlying layer coating liquid containing the phthalocyanine pigment and silica powder and the intermediate and the underlying layer coating liquids both of which contained silica powder.

TABLE 4

| | Parts by weight |
| --- | --- |
| The overlying layer coating composition | |
| Phenolic novolak resin (33% in methyl cellosolve acetate) | 12 |
| Ethylacrylate - methyl methacrylate - methacrylic acid (62-25-13) copolymer (33% in methyl cellosolve acetate) | 3 |
| Phthalocyanine pigment (Sumika print GN-0) | 1.0 |
| Methyl ethyl ketone | 10.2 |
| Methyl cellosolve acetate | 13.8 |
| Fluorocarbon type surface active agent | 0.04 |
| Silica powder (Aerosil produced by DEGUSSA) | 0.2 |
| Viscosity (at 20° C.) | 45 cps |
| The intermediate layer coating composition | |
| Phenolic novolak resin (33% in methyl cellosolve acetate) | 2.0 |
| Pentaerythritol tetraacrylate | 0.1 |
| Methyl ethyl ketone | 2.4 |
| Methyl cellosolve acetate | 5.6 |
| Silica powder (Aerosil produced by DEGUSSA) | 0.15 |
| Viscosity (at 20° C.) | 80 cps |
| The underlying layer coating composition | |
| Ester of naphthoquinone-(1,2)-diazido-(2)-5-sulfonylchloride and poly-p-hydroxystyrene | 7 |
| Phenolic novolak resin | 20 |
| Methyl ethyl ketone | 32.4 |
| Methyl cellosolve acetate | 75.6 |
| Silica powder (Aerosil produced by DEGUSSA) | 1.1 |
| Viscosity (at 20° C.) | 45 cps |

COMPARATIVE EXAMPLE 3

An aluminum plate was processed in the same manner as in Example 3 to prepare a support. The light-sensitive coating liquid having the composition and the viscosity as shown in Table 5 was applied on the support with a wire bar coater in the amount of 36 cc/m² and dried at 100° C. for 2 minutes to prepare a light-sensitive layer on which the coating composition as shown in Table 6 and which had been prepared by the ultrasonic dispersing was applied with an extrusion type hopper coater in the amount of 17.4 cc/m² and dried at 90° C. for one minute to prepare Sample C.

TABLE 5

| | Parts by weight |
| --- | --- |
| Ester of naphthoquinone-(1,2)-diazido-(2) 5-sulfonylchloride and poly-p-hydroxystyrene | 0.7 |
| Phenolic novolak resin | 2.0 |
| Methyl ethyl ketone | 15 |
| Methyl cellosolve acetate | 25 |

TABLE 6

| | Parts by weight |
| --- | --- |
| Phenolic novolak resin (33% in isopropyl alcohol) | 12 |
| Ethyl acrylate - methyl methacrylate - methacrylic acid (62-25-13) copolymer (33% in methanol) | 4 |
| Phthalocyanine pigment (Sumika print GN-0) | 1.0 |
| Toluene | 25 |

COMPARATIVE EXAMPLE 4

In the same manner as in Example 3, an aluminum plate was processed to prepare a support. With the coating device as shown in FIG. 1, the coating liquids having the compositions and viscosities as shown in Table 7 were simultaneously applied on the support traveling at the speed of 50 m/min. in the amount of 17 cc/m² for the overlying layer and 11 cc/m² for the underlying layer and dried with hot air at 90° C. to prepare Sample D.

In this case, electron rays were not irradiated. In the same manner as in Example 3, the overlying layer coating liquid containing the phthalocyanine pigment was prepared by the ultrasonic dispersing.

TABLE 7

| | Parts by weight |
| --- | --- |
| The overlying layer coating composition | |
| Phenolic novolak resin (33% in methyl cellosolve acetate) | 12 |
| Ethyl acrylate - methyl methacrylate - methacrylic acid (62-25-13) copolymer (33% in methyl cellosolve acetate) | 3 |
| Phthalocyanine pigment (Sumika print GN-0) | 1.0 |
| Methyl ethyl ketone | 10.2 |
| Methyl cellosolve acetate | 13.8 |
| Fluorocarbon type surface active agent | 0.04 |
| Viscosity (at 20° C.) | 30 cps |
| The underlying layer coating composition | |
| Ester of naphthoquinone-(1,2)-diazido-(2)- | 7 |

TABLE 7-continued

| | Parts by weight |
|---|---|
| 5-sulfonylchloride and poly-p-hydroxystyrene | |
| Phenolic novolak resin | 20 |
| Methyl ethyl ketone | 32.4 |
| Methyl cellosolve acetate | 75.6 |
| Viscosity (at 20° C.) | 15 cps |

Each of Samples A, B, C and D prepared in Examples 3 and 4 and Comparative Examples 3 and 4, respectively was positively charged with a corona charger set at +6000 V, exposed to light of a 60 lux-tungsten lamp for 3 seconds through a positive transparency, immersed for 20 seconds in a liquid developer comprising a negative toner (MRP-610 produced by RICOH) and air-dried to prepare a positive toner image. With A-3 printer (an exposing device for a presensitized plate, produced by FUJI PHOTO FILM), the whole toner image was exposed to light for 75 seconds and developed for one minute in a developing solution prepared by mixing one part by volume of the developer DP-3 (for a presensitized plate, produced by FUJI PHOTO FILM) with seven parts by volume of water to obtain a printing plate having a positive image thereon.

Printing was carried out with each of the four printing plates obtained from the differently prepared presensitized plates. Background contamination on the printed matter, service life of the printing plates (the number of the printed sheets) and color stain on the printing plates after developing were observed. The results are shown in Table 8.

TABLE 8

| Samples | Service life (Number of printed sheets) | Background contamination | Color stain |
|---|---|---|---|
| A | 140,000 | o | o |
| B | 150,000 | o | o |
| C | 130,000 | o | o |
| D | 90,000 | xx | xx | o: Not observed
xx: Remarkable

EXAMPLE 5

An aluminum support was prepared in the same manner as in Example 3. With the device as shown in FIG. 1, the coating liquids having the compositions and the viscosities as shown in Table 9 were simultaneously applied on the support traveling at the speed of 50 m/min. in the amounts of 15 cc/m² both for the overlying and the underlying layers. Two seconds after coating, the layers applied on the support were irradiated with electron rays under an accelerating voltage of 250 kV at an absorbed dose of 1 Mrad and an irradiation rate of 20 Mrad/sec. in the electron ray irradiator 11 and dried with hot air at 100° C. for 2 minutes in the dryer 12 to prepare Sample E.

The overlying and the underlying layer coating liquids containing silica powder were prepared by ultrasonic dispersing in the same manner as in Example 3.

COMPARATIVE EXAMPLE 5

The same procedures as those of Example 5 were repeated to prepare Sample F, except that pentaerythritol tetraacrylate was eliminated from the overlying layer coating liquid composition as shown in Table 9 and electron ray irradiation was not carried out.

TABLE 9

| | Parts by weight |
|---|---|
| The overlying layer coating composition | |
| Ester of naphthoquinone-(1,2)-diazido-(2)-5-sulfonylchloride and pyrogallol-acetone resin (as described in Example 1 of U.S. Pat. No. 3,635,709) | 1.6 |
| Cresol-formaldehyde resin | 1.2 |
| Tetrahydro phthalic anhydride | 0.1 |
| Naphthoquinone-(1,2)-diazido-4-sulfonylchloride | 0.02 |
| Oil Blue #603 (produced by ORIENT KAGAKU) | 0.03 |
| Methyl ethyl ketone | 10.18 |
| Methyl cellosolve acetate | 23.75 |
| Pentaerythritol tetraacrylate | 0.15 |
| Fluorocarbon type surface active agent | 0.08 |
| Silica powder (Aerosil produced by DEGUSSA) | 1.2 |
| Viscosity (at 20° C.) | 63 cps |
| The underlying layer coating composition | |
| Ester of naphthoquinone-(1,2)-diazido-(2)-5-sulfonylchloride and pyrogallol-acetone resin | 0.2 |
| Phenol-formaldehyde resin | 2.6 |
| Tetrahydrophthalic anhydride | 0.1 |
| Naphthoquinone-(1,2)-diazido-4-sulfonylchloride | 0.02 |
| Oil Blue #603 | 0.03 |
| Methyl ethyl ketone | 10.18 |
| Methyl cellosolve acetate | 23.75 |
| Silica powder (Aerosil produced by DEGUSSA) | 1.0 |
| Viscosity (at 20° C.) | 45 cps |

COMPARATIVE EXAMPLE 6

On an aluminum support prepared in the same manner as in Example 3, there was applied the underlying lager coating composition as shown in Table 9 from which silica powder had been eliminated, in the amount of 13 cc/m² with the device as shown in FIG. 1, and was dried at 100° C. for one minute. On the underlying layer thus prepared, there was applied the overlying layer coating composition as shown in Table 9 from which pentaerythritol tetraacrylate and silica powder had been eliminated, in the amount of 13 cc/m² with device as shown in FIG. 1, and was dried at 100° C. for one minute to prepare Sample G.

COMPARATIVE EXAMPLE 7

On an aluminum support prepared in the same manner as in Example 3, there was applied the coating liquid having the composition as shown in Table 8 with the device as shown in FIG. 1 in the amount of 26 cc/m² and was dried at 100° C. for 2 minutes to prepare Sample H.

TABLE 10

| | Parts by weight |
|---|---|
| Ester of naphthoquinone-(1,2)-diazido-(2)-5-sulfonylchloride and pyrogallol-acetone resin | 1.8 |
| Cresol-formaldehyde resin | 1.2 |
| Phenol-formaldehyde resin | 2.6 |
| Tetrahydrophthalic anhydride | 0.2 |
| Naphthoquinone-(1,2)-diazido-4-sulfonylchloride | 0.04 |
| Oil Blue #603 | 0.06 |
| Methyl ethyl ketone | 20.36 |
| Methyl cellosolve acetate | 47.5 |
| Fluorocarbon type surface active agent | 0.08 |

Each of Samples E, F, G and H was exposed to the light of a 30 ampere-carbon arc lamp at a distance of 70 cm and developed at 25° C. for 60 seconds in a 5.26% aqueous solution (pH: 12.7) of sodium silicate having a SiO$_2$/Na$_2$O molar ratio of 1.74 and sensitivities of these Samples were measured, where appropriate exposure time was such that the light-sensitive layer of the exposed area through the fifth step of a gray scale having a density difference of 0.15 was completely cleared, i.e. dissolved in the developer. The range of appropriate condition for development was shown as the difference in developing time between the time required for clearing the exposed area through the fifth step of the gray scale and that for clearing the exposed area through the sixth step of the gray scale at 25° C. with the same developer. The degree of fat sensitivity was the number of printing paper sheets supplied from the beginning of printing to the complete ink forming to image areas. The results are shown in Table 11.

TABLE 11

| Samples | Appropriate exposure time (Sensitivities) (second) | Range of appropriate developing condition (minute) | Fat sensitivities (The number of printing papers supplied) |
|---|---|---|---|
| E | 70 | 3 | 6 |
| F | 100 | 3 | 10 |
| G | 70 | 3 | 6 |
| H | 100 | 3 | 10 |

EXAMPLE 6

An aluminum support was prepared in the same manner as in Example 3. With the device as shown in FIG. 1, the coating liquids having the compositions and the viscosities as shown in Table 12 were simultaneously applied on the support traveling at the speed of 50 m/min. in the amounts of 16.4 cc/m$^2$ for the overlying layer and 15 cc/m$^2$ for the underlying layer. Two seconds after coating, the layers applied on the support were irradiated with electron rays under an accelerating voltage of 250 kV at an absorbed dose of 1 Mrad and an irradiation rate of 20 Mrad/sec. in the electron ray irradiator 11 and dried with hot air at 100° C. for 90 seconds in the dryer 12 to prepare Sample J.

The overlying and the underlying layer coating liquids containing the high-purity montmorillonite-organic base complex were prepared by ultrasonic dispersing.

TABLE 12

| | Parts by weight |
|---|---|
| The overlying layer coating composition | |
| 2-Hydroxyethyl methacrylate copolymer (as described in Example 1 of U.S. Pat. No. 4,123,276) | 0.38 |
| 2-Methoxy-4-hydroxy-5-benzoylbenzene sulfonic acid salt of p-diazodiphenylamine-paraformaldehyde condensate | 0.1 |
| Oil Blue #603 (produce by ORIENT KAGAKU) | 0.015 |
| Methanol | 3.36 |
| 2-Methoxyethanol | 3.36 |
| Pentaerythritol tetraacrylate | 0.025 |
| High-purity montmorillonite-organic base complex (Benton-27 produced by SHIRAISHI KOGYO) | 0.095 |
| Fluorocarbon type surface active agent | 0.02 |
| Viscosity (at 20° C.) | 65 cps |
| The underlying layer coating composition | |
| 2-Hydroxyethyl methacrylate copolymer | 0.49 |
| Oil Blue #603 | 0.015 |
| Methanol | 3.5 |
| 2-Methoxyethanol | 3.5 |
| High-purity montmorillonite-organic base complex | 0.075 |
| Viscosity (at 20° C.) | 43 cps |

COMPARATIVE EXAMPLE 8

An aluminum support was prepared in the same manner as in Example 3. On the support, there was applied 1 wt.% aqueous solution of methyl methacrylate-ethyl acrylate-sodium 2-acrylamide-2-methylpropane sulfonate (molar ratio: 50/30/20) copolymer (average molecular weight: about 60,000) in the amount of about 0.05 g/m$^2$ (dry weight) with a roll coater and dried to prepare an underlying layer. The coating liquid having the composition as shown in Table 13 was applied on the underlying layer in the amount of 26 cc/m$^2$ (dry weight of 2.0 g/m$^2$) and dried to prepare Sample K.

TABLE 13

| | Parts by weight |
|---|---|
| 2-Hydroxyethyl methacrylate copolymer | 0.87 |
| 2-Methoxy-4-hydroxy-5-benzoylbenzene-sulfonic acid salt of p-diazodiphenylamine-paraformaldehyde condensate | 0.1 |
| Oil Blue #603 | 0.03 |
| Methanol | 6.0 |
| 2-Methoxyethanol | 6.0 |

COMPARATIVE EXAMPLE 9

The same procedures as those in Comparative Example 8 were repeated to prepare Sample L, except that the underlying layer was not provided.

Samples J, K and L were allowed to stand at 40° C. and 80% RH for 5 days and exposed to light, followed by the same treatment as that described in Example 1 of U.S. Pat. No. 4,123,276 to prepare printing plates. Printing was carried out with each of the printing plates J, K and L thus prepared. Background stains were observed on the printed matter obtained with the plate L but not on those obtained with the plates J and K. There was observed little difference in printing performance, including service life in printing, between the plates J and K.

According to this invention, it is possible to simultaneously apply multiple layers of at least two nonaqueous coating liquids to a support without interlayer diffusion or mixing and therefore it is possible to make multilayer coating with a simplified process and lower cost.

Printing plates obtained from presensitized plates prepared according to this invention give printed matter having good quality comparable to those obtained from presensitized plates prepared according to the stepwise coating and drying method of the prior art.

What we claim is:

1. A method for making a multilayer device including at least one light-sensitive material layer, which comprises simultaneously applying multiple layers of at least two nonaqueous coating liquids on a continuously traveling flexible support, at least one of said nonaqueous coating liquids containing an electron radiation curable compound and at least one of said nonaqueous coating liquids containing a light-sensitive material, irradiating the layers applied on the support with electron rays at a rate of 50 Mrad/sec. or less to cure the applied layers or to increase the viscosity thereof, to prevent diffusion between the layers, and then drying the applied layers.

2. The method of claim 1, wherein the time between the simultaneous applying of the multiple layers of the coating liquids and the irradiation thereof is not more than two seconds.

3. The method of claim 1, wherein at least one of said nonaqueous coating liquids has a viscosity of 50 cps or more.

4. The method of claim 1, wherein said light-sensitive composition is one for use in making a light-sensitive layer of a presensitized plate.

5. The method of claim 1, wherein said flexible support is a continuous aluminum sheet having a hydrophilic surface.

6. The method of claim 1, wherein said electron radiation curable compound is selected from the group consisting of compounds having one or more vinyl, vinylidene, epoxy, acryloyl, methacryloyl, acrylamide, allyl, vinylether or vinylthioether groups.

7. The method of claim 1, wherein said electron rays are irradiated under an accelerating voltage of 150 to 300 kV at an absorbed dose of 0.08 to 7 Mrad.

8. The method of claim 1, wherein said light-sensitive composition comprises at least one compound selected from the group consisting diazo resins, o-quinonediazides, light-sensitive azides and polymers having —CH=CH—CO— group in a main or side chain thereof.

* * * * *